United States Patent [19]

Mearini

[11] Patent Number: 6,153,271
[45] Date of Patent: Nov. 28, 2000

[54] ELECTRON BEAM EVAPORATION OF TRANSPARENT INDIUM TIN OXIDE

[75] Inventor: Gerald T. Mearini, Shaker Heights, Ohio

[73] Assignee: General Vacuum, Inc., Cleveland, Ohio

[21] Appl. No.: 09/476,752

[22] Filed: Dec. 30, 1999

[51] Int. Cl.[7] .................................................. C23C 14/08
[52] U.S. Cl. .......................... 427/529; 427/566; 427/567; 427/585; 427/70; 427/255.32
[58] Field of Search ...................... 427/529, 567, 427/566, 585, 66, 69, 70, 255.23, 255.32

[56] References Cited

U.S. PATENT DOCUMENTS

| | | | |
|---|---|---|---|
| 4,177,093 | 12/1979 | Feng et al. | 427/84 |
| 4,564,533 | 1/1986 | Yamazaki | 427/39 |
| 4,605,565 | 8/1986 | Nath | 427/39 |
| 4,728,406 | 3/1988 | Banerjee et al. | 427/39 |
| 4,842,705 | 6/1989 | Mueller | 427/38 |
| 4,904,526 | 2/1990 | Koskenmaki | 427/343 |
| 5,012,064 | 4/1991 | Chang et al. | |
| 5,034,590 | 7/1991 | Yamamoto | |
| 5,110,637 | 5/1992 | Ando et al. | 427/167 |
| 5,616,179 | 4/1997 | Baldwin et al. | |
| 5,714,837 | 2/1998 | Zurn et al. | |

*Primary Examiner*—Shrive Beck
*Assistant Examiner*—Paul D. Strain
*Attorney, Agent, or Firm*—Fay, Sharpe, Fagan, Minnich & McKee, LLP

[57] ABSTRACT

A process for depositing a transparent coating of indium tin oxide on a substrate comprising providing said substrate in a partial vacuum environment and conducting electron beam evaporation of tin oxide doped indium oxide granules while operating an ion source providing oxygen adjacent said substrate until a coating of indium tin oxide is deposited on at least a portion of said substrate.

9 Claims, 1 Drawing Sheet

ELECTRON BEAM EVAPORATION OF TRANSPARENT INDIUM TIN OXIDE

BACKGROUND OF THE INVENTION

This invention is directed to the manufacture of transparent, conductive indium tin oxide layers.

Thin film coatings which conduct electricity while simultaneously allowing transmission of visible light have numerous applications in areas such as flat panel displays, electromagnetic interference (EMI) and radio frequency interference (RFI) shielding. Several materials, such as tin doped indium oxide ($In_2O_3/SnO_2$), known as indium tin oxide, possess a combination of electrical conductivity and visible light transmission. Currently, indium tin oxide, more commonly known as ITO, is the accepted material for liquid crystal display (LCD) applications, as well as EMI shields, due to its combination of low resistivity and high optical transmission. Furthermore, ITO is easily removed using etching techniques for circuit patterning. More precisely, It is known that a cover electrode for image sensor arrays must exhibit a high transparency on the order of at least 85% visible light and must simultaneously exhibit a low electrical sheet resistance of less than 300 ohms/square. Such specifications can only be met by indium-tin oxide (ITO) layers that have either been deposited at temperatures above 200° C. or have been heat treated at temperatures above 440° C. (see the report by Hamberg, et al., J. Appl. Phys. 60 (11) 1986, R 123 thru R 129).

A traditional process for depositing thin ITO films is the plasma sputtering of a $Sn_2O_3$ doped $In_2O_3$ sputter target at elevated temperatures in an oxygen environment. Temperatures must usually exceed 300° C. during deposition to achieve an optically transparent electrically conducted film, but similar quality films can be achieved by heating the substrate after the material has been deposited. In either case, optical transmission as well as electrical conductivity are obtained by the addition of energetic oxygen to the environment. For example, one specific application of indium tin oxide coatings can be found in U.S. Pat. No. 5,704,837 directed to field emission devices with flat panel displays, disclosure of which is incorporated herein by reference. Unfortunately, temperature elevation during the treatment with energetic oxygen, can adversely affect the substrate physically.

Moreover, above 300° C., the photoconductive, amorphous, hydrogen-containing silicon underneath the ITO layer loses its hydrogen content which is critical for its semi-conducting properties. The heat treatment at 440° C. that could lead to meeting the required specifications in the case of cold-deposited and completely structured ITO layers can therefore not be applied (see the report by Raviendrad, et al., Physics Status Solidi (a) 88 (1985) K83 through K86, and the previously cited report by Hamberg, et al.).

In addition to the noted physical restrictions, heating and subsequent cooling of substrates in the course of manufacturing represents a considerable complication in view of the costs and the reduction in throughput times.

When the standard ITO manufacturing methods are modified to meet the restrictions, the specifications of the ITO are rendered noticeably poorer. The performance capability of the image sensors is thereby noticeably decreased.

In European Patent Application No. 0 217 095, to improve the values of resistance (300 ohms per square) with unaltered transparency (90%), heat treating is performed in two steps at a maximum of 200° C., the first heat treating being carried out in an oxygen atmosphere for achieving the transparency and the secondly in a plasma-activated gas atmosphere.

Nonetheless, it would be desirable in this art to provide a method for forming a transparent coating of conductive indium tin oxide at relatively lower temperatures.

SUMMARY OF THE INVENTION

According to one embodiment of the present invention, a process for depositing a transparent coating of indium tin oxide is provided. The process is generally directed to the steps of providing a substrate in a partial vacuum environment and performing electron beam evaporation of an indium tin target. During the performance of the electron beam evaporation, an ion source providing oxygen is operated adjacent to the substrate such that a coating of indium tin oxide is deposited on at least a portion of the substrate. A vacuum of less than $6.0 \times 10^{-6}$ torr is preferably employed for the process.

Preferably, the oxygen ion source is a gridless ion source, more preferably an end hall ion source. According to one embodiment of the invention, the process will be performed at a temperature below 100° C., more preferably between 20 and 60° C. The resultant coating preferably provides at least 90% transmittance at 475 nm and demonstrates a sheet resistance of less than 50 ohms per square.

BRIEF DESCRIPTION OF THE DRAWINGS

While the claims particularly define the subject matter that Applicants regard as their invention, it is believed that the invention can also be well understood from the following description taken in conjunction with the accompanying drawing in which:

DETAILED DESCRIPTION OF THE INVENTION

Figure 1:
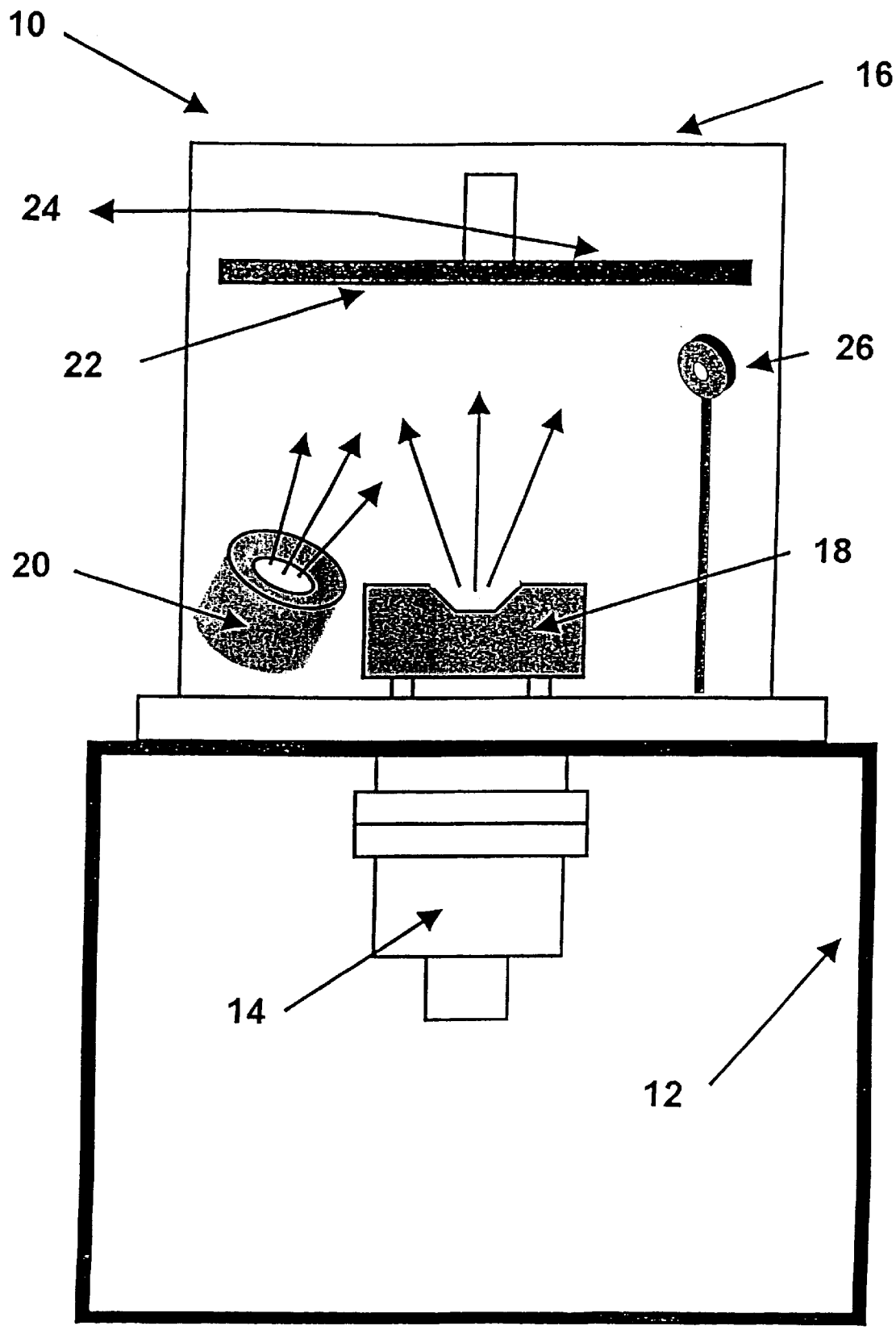
FIG. 1 is a schematic view of a deposition system in accord with the present invention.

The present invention relates to an electron beam evaporation process wherein an evaporant contained within a crucible is evaporated by an electron beam for deposition onto a substrate. More particularly, the present invention relates to an electron beam evaporation source in which the electron beam is vertically deflected into the crucible, through an arc of about 270 degrees, and is deflected in a horizontal plane to impact at predetermined points on the top surface of the evaporant in order to fully utilize the evaporant.

The prior art has provided electron beam evaporation sources that are used in depositing metallic and nonmetallic materials onto a substrate such as in the manufacture of integrated circuits, the coating of ophthalmic lenses, etc. A common design of an electron beam evaporation source utilizes a crucible for containing the material to be evaporated, such material being referred to in the art as an evaporant, and an electron beam emitted by an emitter of an electron beam gun that is vertically deflected through an arc of 270° and into the crucible. The electron beam is vertically deflected by a transverse magnetic field produced by a pair of elongated pole pieces located on opposite sides of the crucible and transversely connected by a permanent magnet. The electron beam gun is located beneath a cover plate connecting the pole pieces in order to prevent the evaporant from spattering onto the emitter.

One important application for electron beam evaporation sources is in molecular beam epitaxy (MBE) in which a thin layer of evaporant is slowly and uniformly deposited onto a substrate in an ultra high vacuum environment. MBE depositions are utilized for providing uniformly doped layers at the junctions of semiconductors and also, in the manufacture of layered integrated circuits. Another important application of electron beam evaporation sources is in the manufacture of ophthalmic lenses. In such application, many thin and uniform layers of evaporant are deposited onto a lens in a high vacuum environment. In such applications, a large crucible is utilized, typically having a volume of 150 cc and above. In the case of MBE the large crucible is utilized because it normally takes a significant period of time to achieve an ultra high vacuum; and thus, it is not practical to stop production and to replenish the crucible before the evaporant has been fully utilized.

In any electron beam evaporation source, the electron beam bores into the evaporant at the impact point of the electron beam on the evaporant. Thus, in order to fully utilize the evaporant in the crucible, particularly in a large crucible, the electron beam is deflected in a horizontal plane, namely in a plane at right angles to the pole pieces or more exactly, one extending across the crucible. Such deflection is accomplished in a predetermined manner in order to selectively reposition the impact point of the electron beam on the evaporant. To this end, the art has provided for the electromagnetic deflection of the electron beam through the use of a U-shaped arrangement of electromagnets located adjacent to the emitter of the electron beam gun. The electromagnets are differentially energized in order to deflect the electron beam in a horizontal plane.

Particular disclosures of electron beam evaporation systems are demonstrated in U.S. Pat. Nos. 5,012,064 and 5,034,590 herein incorporated by reference.

The process to produce transparent conductive coatings (sheet resistance<50 ohm/cm, visible light transmission>90%) of Indium-Tin Oxide (ITO) at room temperature (20–60° C.) requires the operation of a gridless ion source with oxygen while evaporating ITO from an electron beam evaporation source. Any gridless ion source, such as the Commonwealth Mark-II Kaufman Source can be used for this process.

FIG. 1 schematically shows a typical vacuum deposition arrangement for growing ITO films at low temperature using the present process. The evaporation system 10 of the present invention is provided with a frame 12, housing vacuum pump 14 and supporting bell jar 16. Bell jar 16 contains electron beam evaporator 18 and ion source 20. Operation of evaporator 18 and ion source 20 effectively deposits the indium tin oxide coating on substrate 22, which is positioned on substrate support assembly 24. A thickness monitor 26 is provided to give feedback to the process control device (not shown).

ITO is evaporated from the electron beam evaporation source in the same way as any ceramic or metal material. Typically a deposition process control device is used to control the electron beam evaporator since precise adjustments must be made more quickly than a human operator would be capable of. The process controller uses a feedback circuit to adjust the deposition power based on film deposition rate information fed to it via a film thickness monitor. The desired deposition rate and final thickness are entered into the process controller prior to film deposition. The process controller is then responsible for starting the deposition, maintaining all necessary parameters regarding the electron beam evaporator during deposition, then stopping the deposition once the desired film thickness is reached.

Electron beam evaporation of ITO is not sufficient for producing transparent conductive films with properties described above. A steady continuous stream of energetic oxygen ions coincident on the substrate surface during deposition is necessary. These ions are produced using a gridless ion source. The ratio of ITO evaporation rate to oxygen ion current density must be adjusted to optimize the film properties. Since the commercially available ion sources allow adjustment of anode voltage and current through the anode, and the current density is directly dependent on these parameters, anode current at a specified voltage can be used to represent the ion current density. For example, a 100 nm thick film produced using an ITO deposition rate of 0.80 nm/s while operating the ion source at 125V and 3.25 A will have sheet resistance of <45 ohm/square with peak visible transmission >90% at a wavelength of 475 nm when substrates are held approximately 36 inches from the deposition source.

It must be noted that the base pressure before the deposition begins and the pumping speed during the deposition are critical only if they limit the amount of oxygen flowing through the ion source during deposition. If the partial pressure is sufficiently low, the optical properties of the film will be degraded. If this results the starting pressure must be lowered and the pumping speed increased or the outgassing rate of the vacuum system reduced by cleaning or other means to achieve the desired film properties. Generally, a base vacuum chamber pressure of $<6.0\times10^{-6}$ torr is sufficient to start the deposition.

This process can be performed in any environment which allows successful electron beam evaporation of materials. Substrate assemblies, pumping stations chamber size, etc., will not affect the process.

It will be evident that various modifications can be made and described embodiments without departing from the scope of the present invention as set forth in the following claims:

What is claimed is:

1. A process for depositing a transparent coating of indium tin oxide on a substrate comprising locating said substrate in a partial vacuum environment and conducting electron beam evaporation of tin oxide doped indium oxide granules while operating an ion source providing oxygen adjacent said substrate until a coating of indium tin oxide is deposited on at least a portion of said substrate.

2. The process of claim 1 wherein said ion source is gridless.

3. The process of claim 2 wherein said ion source is an end-hall device.

4. The process of claim 1 wherein said indium tin target is comprised of between about 80 and 99% indium oxide and 1 and 20% tin oxide.

5. The process of claim 1 being performed at a temperature of less than 100° C.

6. The process of claim 5 being performed at a temperature between about 20 and 60° C.

7. The process of claim 1 wherein said coating provides at least 90% transmittance at 450 nm.

8. The process of claim 1 wherein said coating has a sheet resistance of less than 50 ohms per square.

9. The process of claim 1 wherein said partial vacuum environment less than about $6.0\times10^{-6}$ torr.

* * * * *